(12) United States Patent
Cablao et al.

(10) Patent No.: US 7,911,046 B2
(45) Date of Patent: Mar. 22, 2011

(54) INTEGRATED CIRCUIT PACKAGING SYSTEM WITH INTERPOSER

(75) Inventors: Philip Lyndon Cablao, Singapore (SG); Rachel Layda Abinan, Singapore (SG); Dario S. Filoteo, Jr., Singapore (SG); Allan P. Ilagan, Singapore (SG)

(73) Assignee: Stats Chippac Ltd., Singapore (SG)

( * ) Notice: Subject to any disclaimer, the term of this patent is extended or adjusted under 35 U.S.C. 154(b) by 16 days.

(21) Appl. No.: 12/391,807

(22) Filed: Feb. 24, 2009

(65) Prior Publication Data
US 2009/0152704 A1    Jun. 18, 2009

Related U.S. Application Data

(63) Continuation of application No. 11/671,684, filed on Feb. 6, 2007, now Pat. No. 7,518,226.

(51) Int. Cl.
*H01L 23/00* (2006.01)
(52) U.S. Cl. ......... 257/686; 257/E23.002; 257/E21.705; 438/107
(58) Field of Classification Search .................. 257/686, 257/E23.002, E21.705
See application file for complete search history.

(56) References Cited

U.S. PATENT DOCUMENTS

| | | | |
|---|---|---|---|
| 5,977,640 | A | 11/1999 | Bertin et al. |
| 6,385,049 | B1 | 5/2002 | Chia-Yu et al. |
| 6,507,098 | B1 * | 1/2003 | Lo et al. ............. 257/686 |
| 6,819,001 | B2 | 11/2004 | Burdick, Jr. et al. |
| 6,893,897 | B2 | 5/2005 | Sweterlitsch |
| 6,906,415 | B2 * | 6/2005 | Jiang et al. ......... 257/723 |
| 6,910,897 | B2 | 6/2005 | Driscoll et al. |
| 6,921,968 | B2 | 7/2005 | Chung |
| 6,979,905 | B2 | 12/2005 | Nishida et al. |
| 2004/0173889 | A1 * | 9/2004 | Akram et al. ....... 257/686 |
| 2004/0188818 | A1 | 9/2004 | Wang |
| 2006/0065972 | A1 * | 3/2006 | Khan et al. .......... 257/712 |
| 2006/0197209 | A1 | 9/2006 | Choi et al. |
| 2008/0042265 | A1 | 2/2008 | Merilo et al. |

* cited by examiner

*Primary Examiner* — Benjamin P Sandvik
*Assistant Examiner* — Krista Soderholm
(74) *Attorney, Agent, or Firm* — Mikio Ishimaru

(57) ABSTRACT

An integrated circuit packaging system is provided including forming an interposer having a coupling slot, securing an upper die on the interposer, mounting the interposer over an integrated circuit, and coupling the integrated circuit to the upper die through the coupling slot.

17 Claims, 5 Drawing Sheets

INTEGRATED CIRCUIT PACKAGING SYSTEM WITH INTERPOSER

CROSS-REFERENCE TO RELATED APPLICATION(S)

This application is a Continuation of co-pending U.S. application Ser. No. 11/671,684 filed Feb. 6, 2007, and the subject matter thereof is hereby incorporated herein by reference thereto.

The present application contains subject matter related to co-pending U.S. patent application Ser. No. 11/464,699. The related application is assigned to STATS ChipPAC.

TECHNICAL FIELD

The present invention relates generally to integrated circuit packaging, and more particularly to a system for packaging System-in-Package configurations.

BACKGROUND ART

Semiconductors, or integrated circuits (IC's), are found in virtually every electrical product manufactured today. IC's are used not only in very sophisticated industrial and commercial electronic equipment, but also in many household and consumer items such as televisions, clothes washers and dryers, radios, and telephones. As products become smaller but more functional, there is a need to include more IC's in the smaller products to perform the functionality. The shrinking of cellular telephones that also function as cameras, internet access devices, and music players is one example of how more and more capabilities are incorporated into smaller and smaller electronic products.

As the demand for semiconductor devices with low-cost, high performance, increased miniaturization, and greater packaging densities has increased, Multi-Chip Module (MCM) structures have been developed to meet the demand. MCM structures have a number of dies and other components mounted within a single integrated circuit package. The number of dies and other components can be mounted in a vertical manner, a lateral manner, or combinations thereof.

One such approach is to stack one die on top of another and then enclose the stack of dies in one package. The final package for a semiconductor with stacked dies is much smaller than would result if the dies were each packaged separately. In addition to providing a smaller size, stacked-die packages offer a number of advantages that relate to the manufacturing of the package, such as ease of handling and assembly.

In a stacked-die arrangement, the dice are sequentially coupled, typically with automated wire-bonding equipment employing well-known thermal compression or ultrasonic wire-bonding techniques. During the wire-bonding process, the head of a wire-bonding apparatus applies a downward pressure on a conductive wire held in contact with a wire-bonding pad on the die to weld, or bond, the wire to the bonding pad on the die. In many cases, stacked dice can be fabricated faster and less expensively than several semiconductors, each having a single die, which perform the same functions. The stacked dice approach is beneficial because of the increase in circuit density, improvement in signal quality of embedded interconnects, and achieved within the integrated circuit package.

While a stacked-die arrangement may produce a more efficient package structure, the process is subject to yield fall-out due failed components in the stack. A single weak or broken coupling can cause the entire package to be inoperative. Many of the MCM structures that are needed today require the addition of integrated passive devices (IPD's), such as resistors, capacitors, or inductors.

Thus, a need remains for an integrated circuit packaging system that reliably and economically produces a system-in-package (SIP) device. In view of the continued pressure to incorporate additional functions in smaller packages, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including forming an interposer having a coupling slot, securing an upper die on the interposer, mounting the interposer over an integrated circuit, and coupling the integrated circuit to the upper die through the coupling slot.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
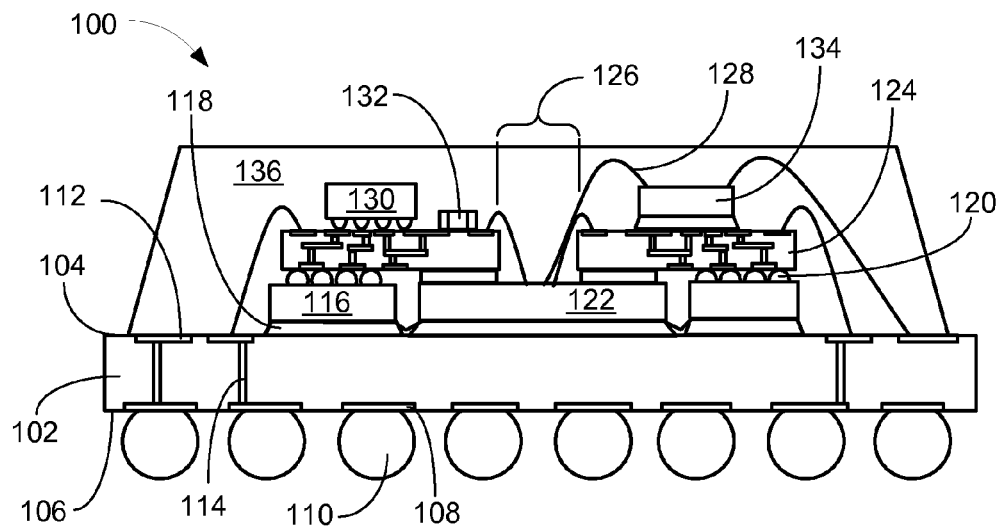
FIG. 1 is a cross-sectional view of an integrated circuit packaging system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit packaging system 100, in an embodiment of the present invention. The cross-sectional view of the integrated circuit packaging system 100 depicts a substrate 102 having a component side 104 and a connection side 106. Connection pads 108 are formed on the connection side of the substrate 102. System interconnects 110, such as solder balls, stud bumps, solder bumps, or solder columns are connected to the connection pads 108 for attachment of the integrated circuit packaging system 100 to the next level system. A bonding pad 112, located on the component side 104, may be connected to the connection pads 108 by an internal connection 114.

A first integrated circuit 116, such as a flip chip integrated circuit, may be mounted on the component side 104 by an adhesive 118. The first integrated circuit 116 having connection bumps 120, such as solder bumps, stud bumps, or solder columns, may be positioned around a second integrated circuit 122 mounted on the component side 104 by the adhesive 118. An interposer 124, having a coupling slot 126, is electrically connected to the connection bumps 120 and mounted on the second integrated circuit 122 by the adhesive 118, such as a die attach material or thermally conductive epoxy. The coupling slot 126 may be an opening in the interior portion of the interposer 124. The coupling slot 126 may be of various shapes, but has a minimum width that allows access to tooling for applying electrical interconnects 128.

A first upper die 130, such as a flip chip integrated circuit, is electrically connected to the surface of the interposer 124 that is opposite the surface connected to the connection bumps 120. An integrated passive device 132, such as a resistor, a capacitor, or an inductor, may be connected on the vicinity of the first upper die 130. A second upper die 134, such as an integrated circuit die, may be mounted on the same surface as the integrated passive device 132 by the adhesive 118. The electrical interconnects 128 may electrically couple the second upper die 134 to the second integrated circuit 122, through the coupling slot 126. The second upper die 134 may also be coupled to the component side 104 of the substrate 102. The electrical interconnects 128 may also connect the component side 104 of the substrate 102 to the interposer 124 in the vicinity of the first upper die 130 or the second upper die 134.

A mold cap 136, such as an epoxy molding compound, is formed over the component side 104 of the substrate 102. The mold cap 136 encapsulates the first integrated circuit 116, the second integrated circuit 122, the first upper die 130, the second upper die 134, the integrated passive device 132, and the electrical interconnects 128. The mold cap 136 may have a thickness in the range of 1.1 mm to 1.2 mm.

Figure 2:
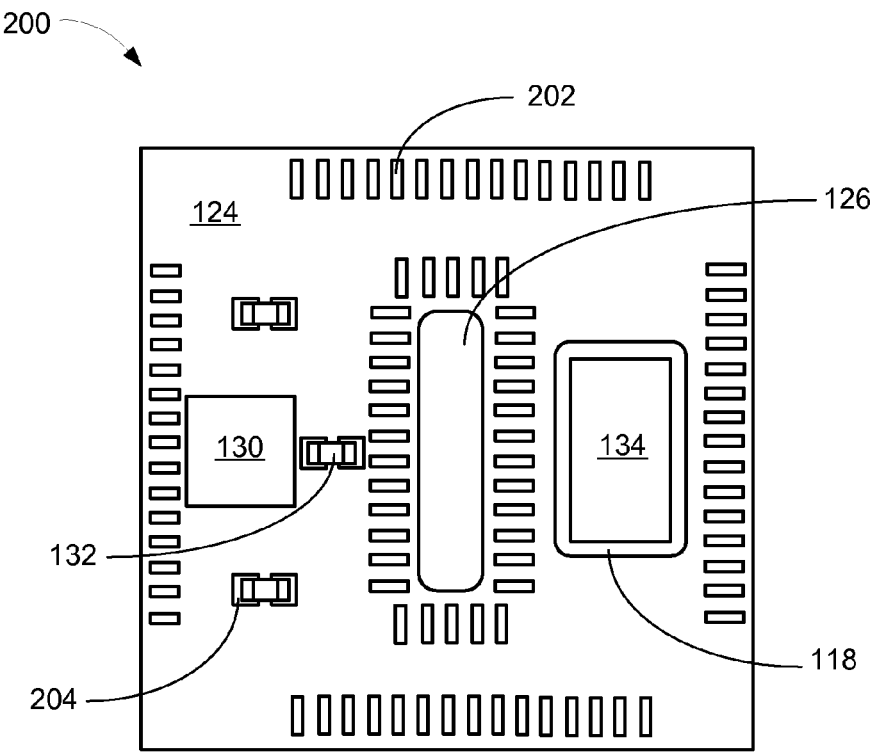
FIG. 2 is a top view of an interposer assembly having the coupling slot, in an embodiment of the present invention.

Referring now to FIG. 2, therein is shown a top view of an interposer assembly 200 having the coupling slot 126, in an embodiment of the present invention. The top view of the interposer assembly 200 depicts the interposer 124 having the coupling slot 126 positioned in the interior section. Bonding pads 202 are arranged around the edges of the interposer 124 and the coupling slot 126. The first upper die 130 is connected adjacent to the integrated passive device 132. The second upper die 134 is mounted, on the other side of the coupling slot 126, by the adhesive 118. The integrated passive device 132 is connected to component pads 204.

It has been discovered that the interposer 124 may be previously assembled, with the first upper die 130, the integrated passive device 132, and the second upper die 134, and tested for proper operation prior to assembly in the next level package. This ability provides an increase in manufacturing yield, thus providing a reduction in cost to the finished product. The above stated example indicates the first upper die 130 and the second upper die 134 are coupled to the interposer 124, but it is understood that any number of upper die may be coupled to the interposer 124. As well a single unit of the integrated passive device 132 is discussed, but any number and mix of the integrated passive device 132 is possible.

Figure 3:
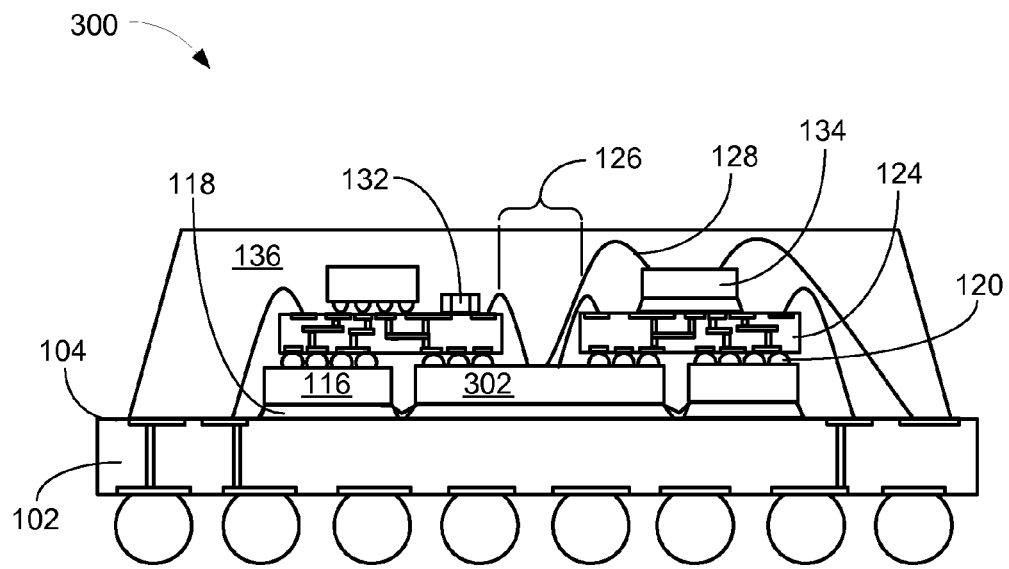
FIG. 3 is a cross-sectional view of an integrated circuit packaging system, in an alternative embodiment of the present invention.

Referring now to FIG. 3 therein is shown a cross-sectional view of an integrated circuit packaging system 300, in an alternative embodiment of the present invention. The cross-sectional view of the integrated circuit packaging system 300 depicts the first integrated circuit 116 mounted on the component side 104 of the substrate 102. A second integrated circuit 302, such as a flip chip integrated circuit is mounted by the adhesive 118 to the component side 104. The connection bumps 120 of the second integrated circuit 302 may be electrically connected to the bottom surface of the interposer 124. Additional signals may be connected between the second integrated circuit 302 and the top surface of the interposer 124, the integrated passive device 132, or the second upper die 134 by attaching the electrical interconnects 128 through the coupling slot 126. The mold cap 136 is formed over the component side 104 of the substrate 102.

Figure 4:
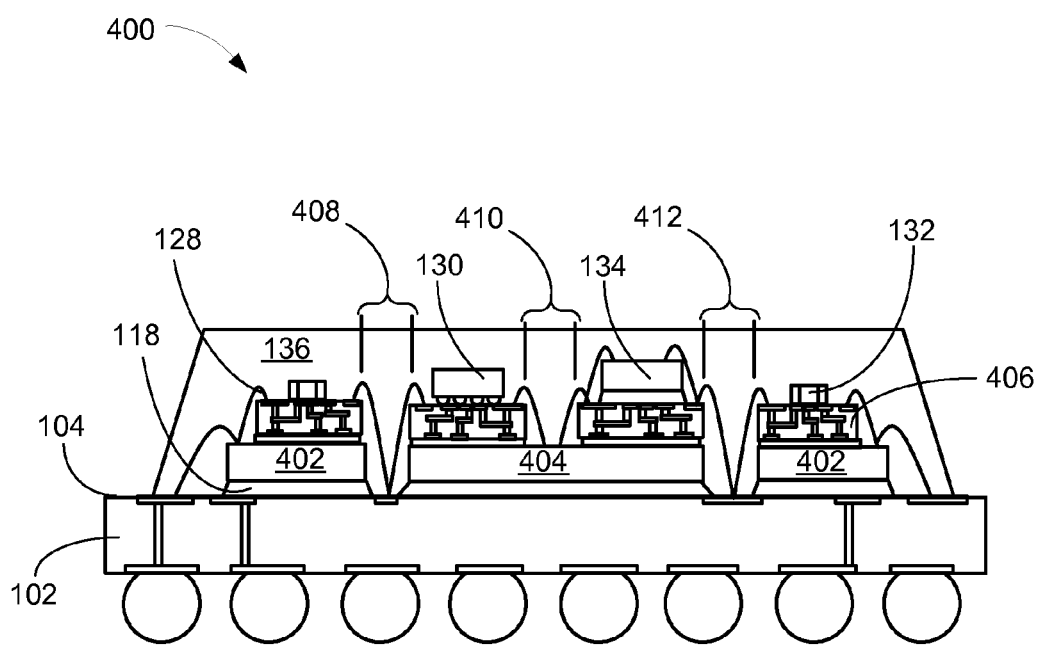
FIG. 4 is a cross-sectional view of an integrated circuit packaging system, in another alternative embodiment of the present invention.

Referring now to FIG. 4 therein is shown a cross-sectional view of an integrated circuit packaging system 400, in another alternative embodiment of the present invention. The cross-sectional view of the integrated circuit packaging system 400 depicts the substrate 102 with a first integrated circuit die 402 mounted on the component side 104 by the adhesive 118. A second integrated circuit die 404 is mounted, near the first integrated circuit die 402, by the adhesive 118. An interposer 406 is mounted over the first integrated circuit die 402 and the second integrated circuit die 404 by the adhesive 118. The interposer 406 has a first coupling slot 408, a second coupling slot 410, and a third coupling slot 412.

The first upper die 130 may be connected to the interposer 406 through flip chip attach. The second upper die 134 may be mounted on the interposer 406 by the adhesive 118. The electrical interconnects 128 may be used to couple the second upper die 134 to the second integrated circuit die 404 through the second coupling slot 410. The second upper die 134 may also be connected to the component side 104 of the substrate 102 through the third coupling slot 412.

Figure 5:
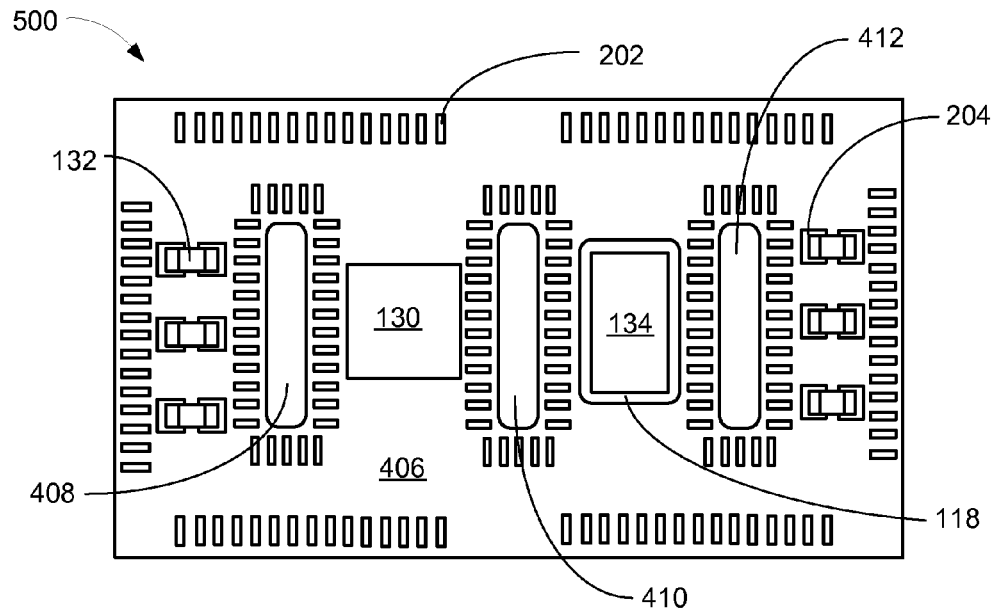
FIG. 5 is a top view of an interposer assembly having a plurality of coupling slots, in an alternative embodiment of the present invention.

Referring now to FIG. 5 therein is shown a top view of an interposer assembly 500 having a plurality of coupling slots, in an alternative embodiment of the present invention. The top view of the interposer assembly 500 depicts the interposer 406 having a plurality of the coupling slots 410 in the interior section. The bonding pads 202 are arranged around the edges of the interposer 406 as well as surrounding the first coupling slot 408, the second coupling slot 410, and the third coupling slot 412.

The first upper die 130 is electrically connected to the interposer 406 between the first coupling slot 408 and the second coupling slot 410. The second upper die 134 is mounted, by the adhesive 118, on the interposer 406 between the second coupling slot 410 and the third coupling slot 412. A plurality of the integrated passive device 132 may be electrically connected to the component pad 204 disbursed around the interposer 406.

Figure 6:
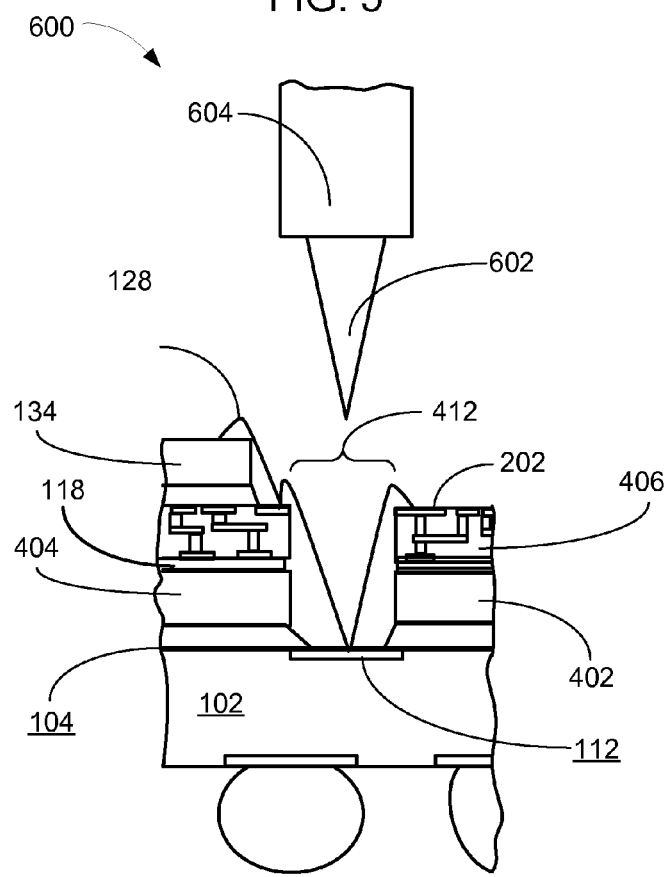
FIG. 6 is an enlarged cross-sectional view of a segment of the integrated circuit packaging system in an electrical coupling phase of manufacturing.

Referring now to FIG. 6 therein is shown an enlarged cross-sectional view of a segment 600 of the integrated circuit packaging system 100 in an electrical coupling phase of manufacturing. The enlarged cross-sectional view of the segment 600 depicts the substrate 102 having the bonding pad 112, on the component side 104, positioned between the first integrated circuit die 402 and the second integrated circuit die 404. The interposer 406 is mounted on the first integrated circuit die 402 and the second integrated circuit die 404 by the adhesive 118. The second upper die 134 is mounted on top of the interposer 406 by the adhesive 118.

A coupling capillary 602 is mounted on a bonding machine 604. The shape of the coupling capillary 602 allows it to reach through the third coupling slot 412 for bonding, either thermally or ultrasonically, the electrical interconnect 128 to the bonding pad 112. The other end of the electrical interconnect 128 may be bonded to the bonding pad 202, on the top of the interposer 406, the second upper die 134, or a combination thereof. It is understood that the bonding exercise stated above is an example and the coupling capillary 602 may be used to bond the electrical interconnects 128 to any of the bonding pad 112 that is accessible.

The dimensions of the third coupling slot 412 may assume any shape, but the minimum width of the third coupling slot 412 may be calculated by equation 1.

$$W_{min}=2((\tan\theta)(H+WH)+TW) \quad (1)$$

Where $W_{min}$ is the minimum width of the third coupling slot 412, the angle $\theta$ is the cone angle of the coupling capillary 602, H is the distance from the surface of the bonding pad 112 to the top surface of the interposer 406, WH is the height of the wire sweep required to cross over the corner of the interposer 406 from the attach point on the bonding pad 202 on the top surface of the interposer 406, and TW is the width of the tip of the coupling capillary. As an example, the coupling capillary 602 having a tip width of 0.1 mm and an angle $\theta$ of 20°, reaching into a combined height of 0.6 mm and requiring a wire sweep height of 0.25 mm to clear the corner of the interposer 406, would allow the following:

$$W_{min}=2((\tan 20°)(0.6+0.25)+0.1)=0.82 \text{ mm} \quad (1)$$

In the previous example, the combined height (H) includes the thickness of the adhesive 118 on the component side 104, the thickness of the first integrated circuit die 402, the thickness of the adhesive 118 between the first integrated circuit die 402 and the interposer 406, and finally the thickness of the interposer 406. The values used for this example are within current manufacturing standards for these components.

Figure 7:
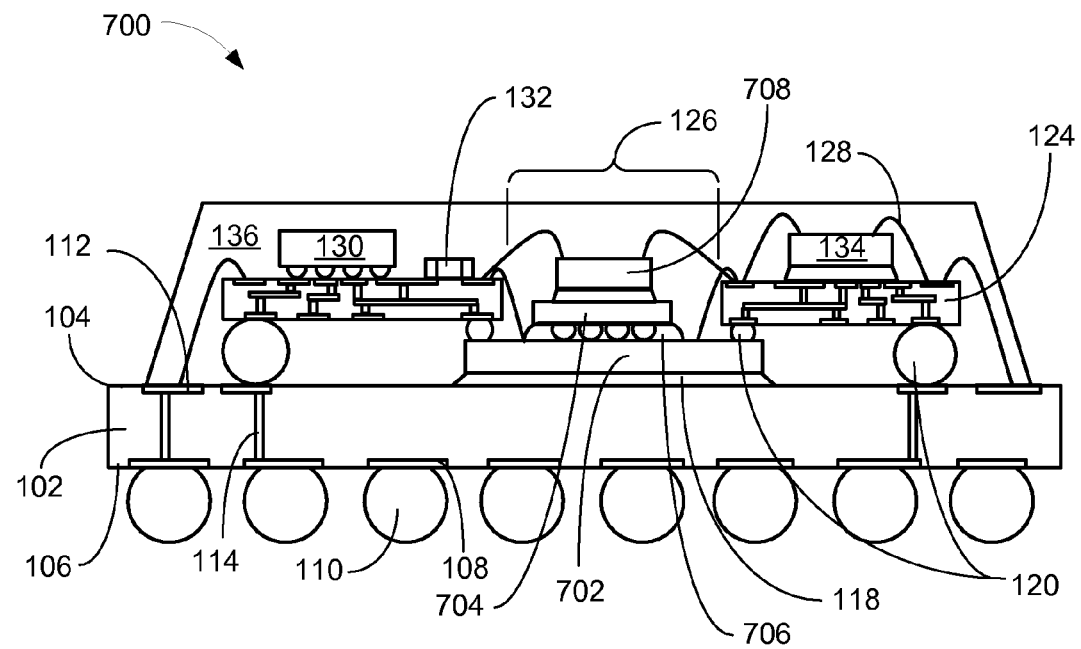
FIG. 7 is a cross-sectional view of the integrated circuit packaging system, in yet another alternative embodiment of the present invention.

Referring now to FIG. 7 therein is shown a cross-sectional view of an integrated circuit packaging system 700, in yet another alternative embodiment of the present invention. The cross-sectional view of the integrated circuit packaging system 700 depicts the substrate 102 having the component side 104 and the connection side 106. The connection pads 108 are formed on the connection side of the substrate 102. The system interconnects 110, such as solder balls, stud bumps, solder bumps, or solder columns are connected to the connection pads 108 for attachment of the integrated circuit packaging system 100 to the next level system. The bonding pad 112, located on the component side 104, may be connected to the connection pads 108 by the internal connection 114.

A first integrated circuit 702, such as a flip chip integrated circuit, may be mounted on the component side 104 by the adhesive 118. The first integrated circuit 702 having the connection bumps 120, such as solder bumps, stud bumps, or solder columns, may be positioned in the center the component side 104 by the adhesive 118. The interposer 124, having the coupling slot 126, is electrically connected to the connection bumps 120 coupled to the first integrated circuit 702 and mounted on a second set of the connection bumps 120 coupled to the component side 104. The coupling slot 126 may be an opening in the interior portion of the interposer 124. The coupling slot 126 may be of various shapes, but has the minimum width that allows access to tooling for applying the electrical interconnects 128.

A second integrated circuit 704, such as a flip chip integrated circuit, may be electrically connected to the exposed contact pads (not shown) of the first integrated circuit 702. An adhesive material 706, such as an under-fill material, supports the second integrated circuit 704. The second integrated circuit 704 is positioned within the coupling slot 126 of the interposer 124. The coupling slot 126 may be wide enough to allow the placement of the second integrated circuit 704 and the attachment of the electrical interconnect 128 between the top surface of the interposer 124 and the surface of the first integrated circuit 702.

The first upper die 130, such as a flip chip integrated circuit, is electrically connected to the top surface of the interposer 124 that is opposite the surface connected to the connection bumps 120. The integrated passive device 132, such as a resistor, a capacitor, or an inductor, may be connected on the vicinity of the first upper die 130. The second upper die 134, such as an integrated circuit die, may be mounted on the same surface as the integrated passive device 132 by the adhesive 118. The electrical interconnects 128 may electrically couple the second upper die 134 to the first integrated circuit 702, through the coupling slot 126. The second upper die 134 may also be coupled to the component side 104 of the substrate 102. The electrical interconnects 128 may also connect the component side 104 of the substrate 102 to the interposer 124 in the vicinity of the first upper die 130 or the second upper die 134.

A fifth integrated circuit 708 may be mounted on top of the second integrated circuit 704. The adhesive 118 may be used to mount the fifth integrated circuit 708 and the electrical interconnects 128 may be used to couple the fifth integrated circuit 708 to the interposer 124, the first integrated circuit 702, the component side 104, or a combination thereof.

The mold cap 136, such as an epoxy molding compound, is formed over the component side 104 of the substrate 102. The mold cap 136 encapsulates the first integrated circuit 702, the second integrated circuit 704, the first upper die 130, the second upper die 134, the integrated passive device 132, the fifth integrated circuit 708, and the electrical interconnects 128. The mold cap 136 may have a thickness in the range of 1.1 mm to 1.2 mm.

Figure 8:
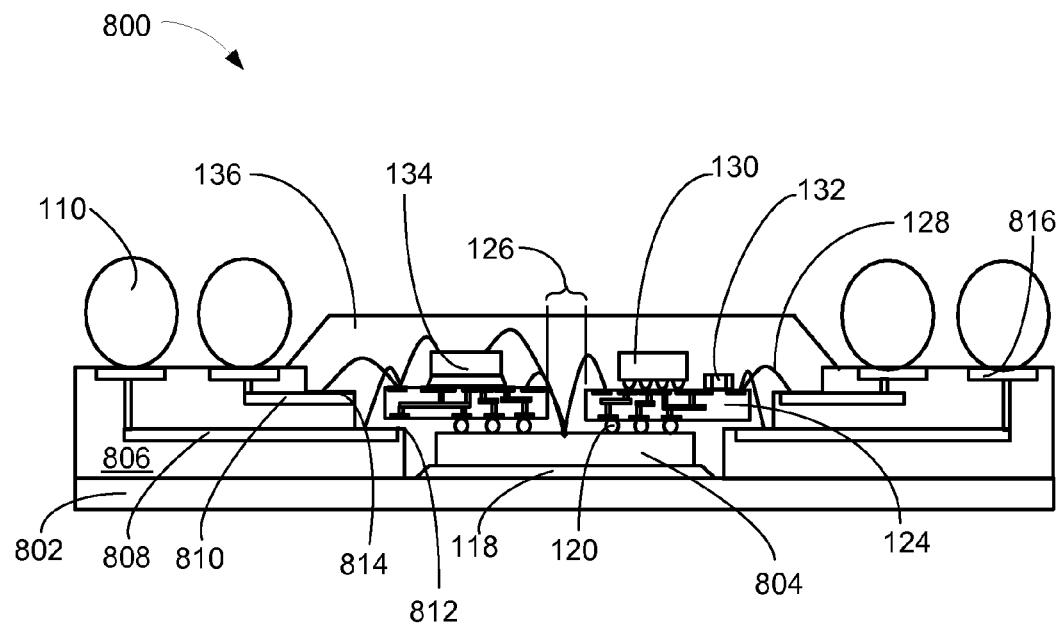
FIG. 8 is a cross-sectional view of an enhanced ball grid array (EBGA) package, in still another alternative embodiment of the present invention.

Referring now to FIG. 8 therein is shown a cross-sectional view of an enhanced ball grid array (EBGA) package 800, in still another alternative embodiment of the present invention. The cross-sectional view of the enhanced ball grid array (EBGA) package 800 depicts a cover 802, such as a heat sink, having a first integrated circuit 804 mounted by the adhesive 118. The first integrated circuit 804 may be a flip chip integrated circuit die having the connection bumps 120. An enhanced ball grid array (EBGA) substrate 806 surrounds the first integrated circuit 804. The EBGA substrate 806 has a first level signal trace 808 and a second level signal trace 810. The EBGA substrate 806 is formed with a cavity that provides a first step 812, having an exposed section of the first level signal trace 808, and a second step 814 having an exposed section of the second level signal trace 810.

The interposer 124 may be coupled to the connection bumps 120 of the first integrated circuit 804. Further signal interconnects are provided by connecting the electrical interconnects 128 through the coupling slot 126 between the first integrated circuit 804 and the top surface of the interposer 124. The electrical interconnects 128 are also coupled between the top surface of the interposer 124, the first level signal trace 808, and the second level signal trace.

The interposer 124 carries the first upper die 130, the integrated passive device 132, and the second upper die 134. The second upper die 134 may be electrically connected to the first integrated circuit 804, the first level signal trace 808, the second level signal trace, the top surface of the interposer 124, or a combination thereof. The mold cap 136 encapsulates the first integrated circuit 804, the interposer 124, the first upper die 130, the integrated passive device 132, the second upper die 134, the electrical interconnects 128, the first step 812 and the second step 814. The system interconnects 110 are coupled to system pads 816 for connection to the next level system, such as a printed circuit board (not shown).

Figure 9:
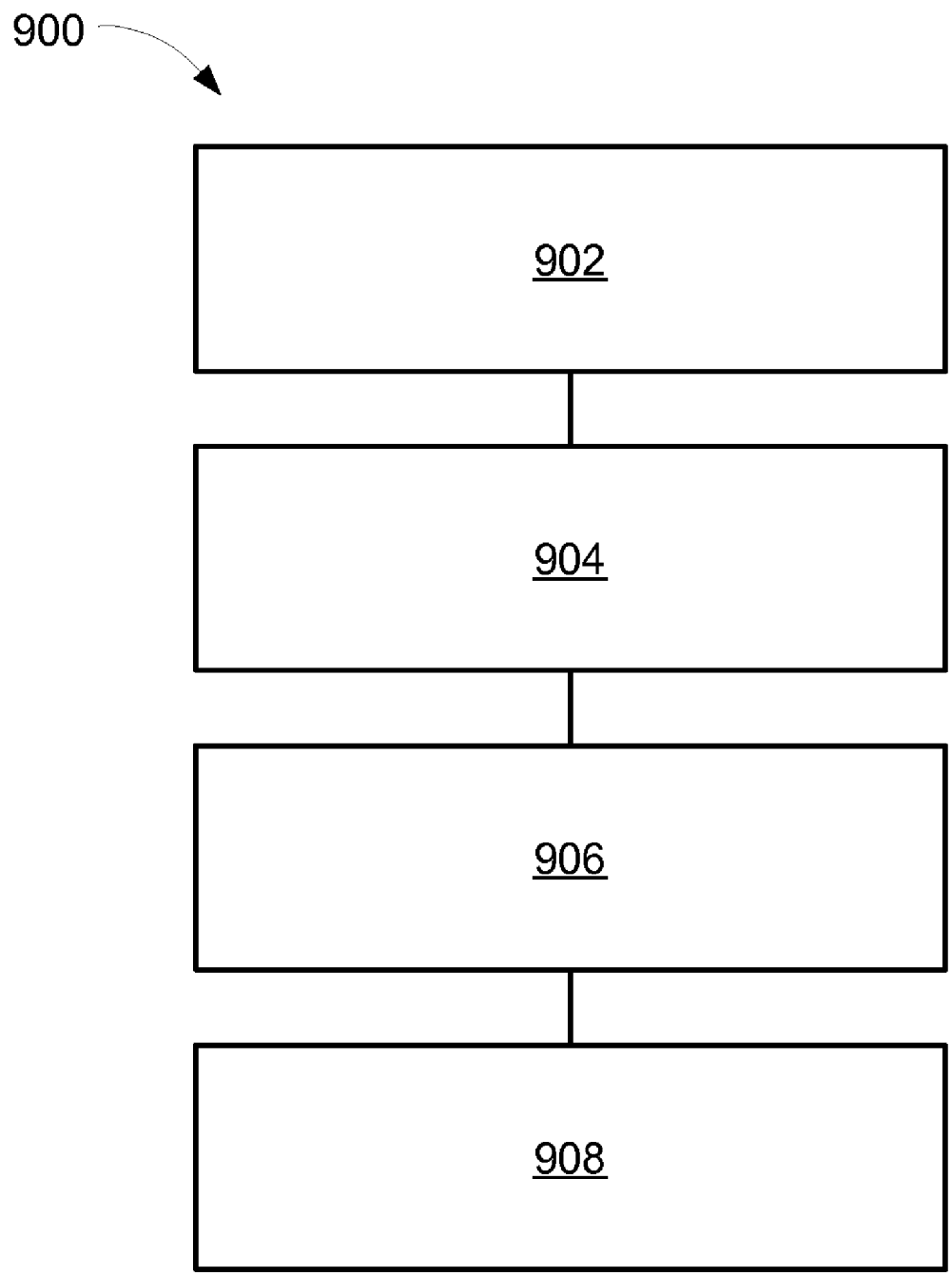
FIG. 9 is a flow chart of an integrated circuit packaging system for manufacturing the integrated circuit packaging system in an embodiment of the present invention.

Referring now to FIG. 9, therein is shown a flow chart of an integrated circuit packaging system 900 for manufacturing the integrated circuit packaging system 100 with the interposer 124 in an embodiment of the present invention. The system 900 includes forming an interposer having a coupling slot in a block 902; securing an upper die on the interposer in a block 904; mounting the interposer over an integrated circuit in a block 906; and coupling the integrated circuit to the upper die through the coupling slot in a block 908.

An important aspect of the present invention is that it valuably supports and services the historical trend of reducing costs, simplifying systems, and increasing performance. These and other valuable aspects of the present invention consequently further the state of the technology to at least the next level.

Thus, it has been discovered that the integrated circuit packaging system with interposer of the present invention furnishes important and heretofore unknown and unavailable solutions, capabilities, and functional aspects for providing system-in-package solutions that were previously not possible in low cost and high volume production. The resulting processes and configurations are straightforward, cost-effective, uncomplicated, highly versatile and effective, can be surprisingly and unobviously implemented by adapting known technologies, and are thus readily suited for efficiently and economically manufacturing system-in-package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
    forming an interposer having a coupling slot;
    securing an upper die on the interposer;
    providing a substrate having an integrated circuit on a component side and system interconnects on a connection side including
    mounting the interposer over the integrated circuit; and
    coupling the integrated circuit to the upper die through the coupling slot.

2. The method as claimed in claim 1 further comprising:
    mounting a second integrated circuit on the substrate; and
    electrically connecting the second integrated circuit to the interposer.

3. The method system as claimed in claim 1 further comprising:
    securing a second upper die on the interposer;
    coupling an integrated passive device to the interposer; and
    electrically connecting the upper die, the second upper die, the integrated passive device, or a combination thereof to the integrated circuit.

4. The method as claimed in claim 1 wherein coupling the integrated circuit to the upper die includes bonding an electrical interconnect.

5. A method of manufacturing an integrated circuit packaging system comprising:
    forming an interposer having a coupling slot;
    forming bond pads around the coupling slot;
    securing an upper die on the interposer including electrically connecting the upper die to a bond pad;
    providing a substrate having an integrated circuit on a component side and system interconnects on a system side including mounting the interposer over the integrated circuit including positioning the coupling slot over the integrated circuit; and
    coupling the integrated circuit to the upper die through the coupling slot including bonding an electrical interconnect through the coupling slot.

6. The method as claimed in claim 5 further comprising:
    mounting a second integrated circuit on the substrate adjacent to the integrated circuit; and
    electrically connecting the second integrated circuit to the interposer including electrically connecting the integrated circuit to the second integrated circuit through the interposer.

7. The method as claimed in claim 5 further comprising:
securing a second upper die on the interposer including electrically connecting the second upper die to the interposer;
coupling an integrated passive device to the interposer includes electrically connecting the integrated passive device to the upper die, the second upper die, the bond pad, or a combination thereof; and
electrically connecting the upper die, the second upper die, the integrated passive device, or a combination thereof to the integrated circuit includes bonding the electrical interconnect between the bond pad and the integrated circuit.

8. The method as claimed in claim 5 wherein coupling the integrated circuit to the upper die includes connecting the electrical interconnect to the bond pad on the interposer.

9. An integrated circuit packaging system comprising:
an interposer having a coupling slot;
an upper die on the interposer;
a substrate having an integrated circuit on a component side and system interconnects on a system side includes the interposer over an the integrated circuit; and
the integrated circuit coupled to the upper die through the coupling slot.

10. The system as claimed in claim 9 further comprising:
a second integrated circuit on the substrate; and
the second integrated circuit electrically connected to the interposer.

11. The system as claimed in claim 9 further comprising:
a second upper die on the interposer;
an integrated passive device coupled to the interposer; and
the upper die, the second upper die, the integrated passive device, or a combination thereof electrically connected to the integrated circuit.

12. The system as claimed in claim 9 wherein the integrated circuit coupled to the upper die includes an electrical interconnect bonded to the integrated circuit.

13. The system as claimed in claim 9 further comprising:
bond pads formed around the coupling slot;
the upper die electrically connected to a bond pad;
the coupling slot positioned over the integrated circuit; and
an electrical interconnect bonded through the coupling slot.

14. The system as claimed in claim 13 further comprising:
an adhesive between the substrate and the integrated circuit;
a second integrated circuit on the substrate adjacent to the integrated circuit; and
the second integrated circuit electrically connected to the interposer includes the integrated circuit electrically connected to the second integrated circuit through the interposer.

15. The system as claimed in claim 13 further comprising:
a second upper die on the interposer includes the second upper die electrically connected to the interposer;
an integrated passive device coupled to the interposer includes the integrated passive device electrically connected to the upper die, the second upper die, the bond pad, or a combination thereof; and
the upper die, the second upper die, the integrated passive device, or a combination thereof electrically connected to the integrated circuit includes the electrical interconnect bonded between the bond pad and the integrated circuit.

16. The system as claimed in claim 13 wherein the integrated circuit coupled to the upper die includes the electrical interconnect connected to the bond pad on the interposer.

17. The system as claimed in claim 13 wherein:
the substrate includes an enhanced ball grid array substrate having a first signal trace in a first step and a second signal trace in a second step;
the integrated circuit mounted adjacent to the first step;
the interposer mounted over the first step; and
the integrated circuit electrically connected to the first signal trace, the second signal trace, or a combination thereof through the interposer.

\* \* \* \* \*

UNITED STATES PATENT AND TRADEMARK OFFICE
CERTIFICATE OF CORRECTION

| | | |
|---|---|---|
| PATENT NO. | : 7,911,046 B2 | Page 1 of 1 |
| APPLICATION NO. | : 12/391807 | |
| DATED | : March 22, 2011 | |
| INVENTOR(S) | : Cablao et al. | |

It is certified that error appears in the above-identified patent and that said Letters Patent is hereby corrected as shown below:

<u>Column 8:</u>
      Line 37, claim 3, delete "method system" and insert therefor --method--

<u>Column 9:</u>
      Line 21, claim 9, delete "over an the" and insert therefor --over the--

Signed and Sealed this
Thirty-first Day of May, 2011

David J. Kappos
*Director of the United States Patent and Trademark Office*